United States Patent
Chuang et al.

(10) Patent No.: US 11,899,196 B2
(45) Date of Patent: Feb. 13, 2024

(54) LIGHT HOMOGENIZING ELEMENT

(71) Applicant: Coretronic Corporation, Hsin-Chu (TW)

(72) Inventors: Fu-Ming Chuang, Hsin-Chu (TW); Hung-Ta Chien, Hsin-Chu (TW)

(73) Assignee: Coretronic Corporation, Hsin-Chu (TW)

(*) Notice: Subject to any disclaimer, the term of this patent is extended or adjusted under 35 U.S.C. 154(b) by 0 days.

(21) Appl. No.: 17/700,509

(22) Filed: Mar. 22, 2022

(65) Prior Publication Data
US 2022/0308335 A1    Sep. 29, 2022

(30) Foreign Application Priority Data
Mar. 25, 2021   (CN) .......................... 202110318884.5

(51) Int. Cl.
*G02B 26/08* (2006.01)
*G02B 5/02* (2006.01)
(Continued)

(52) U.S. Cl.
CPC ........... *G02B 26/08* (2013.01); *G02B 5/0278* (2013.01); *G02B 26/004* (2013.01); *G02B 27/30* (2013.01);
(Continued)

(58) Field of Classification Search
CPC .... G02B 26/08; G02B 5/0231; G02B 5/0215; G02B 27/09; G02B 5/0294; G02B 27/48
See application file for complete search history.

(56) References Cited

U.S. PATENT DOCUMENTS

| | | | |
|---|---|---|---|
| 2004/0184155 A1 | 9/2004 | Kornblit et al. | |
| 2008/0192327 A1* | 8/2008 | Abu-Ageel | G02B 27/48 |
| | | | 359/237 |

(Continued)

FOREIGN PATENT DOCUMENTS

| | | |
|---|---|---|
| CN | 101395523 | 3/2009 |
| CN | 101685171 | 3/2010 |

(Continued)

OTHER PUBLICATIONS

"Search Report of Europe Counterpart Application", dated Aug. 16, 2022, p. 1-p. 9.

(Continued)

*Primary Examiner* — Joseph P Martinez
(74) *Attorney, Agent, or Firm* — JCIPRNET

(57) ABSTRACT

A light homogenizing element includes a light incident surface and at least one diffusion surface, including: a first substrate, a carrier layer, a piezoelectric film, a driving electrode, a light-transmitting layer, and multiple light diffusion microstructures. The first substrate includes a first surface and a second surface opposite to each other. The carrier layer is located on the first surface of the first substrate and includes a light passing region penetrating the carrier layer, and includes a protruding structure enclosing the light passing region. The light-transmitting layer is provided overlapping on the protruding structure, and the surface of the light-transmitting layer covering the light passing region is the light incident surface. The multiple light diffusion microstructures are provided on the at least one diffusion surface, and projections of the multiple light diffusion microstructures on the light-transmitting layer are located in the light passing region.

17 Claims, 15 Drawing Sheets

(51) Int. Cl.
  *G02B 26/00* (2006.01)
  *G02B 27/30* (2006.01)
  *H10N 30/80* (2023.01)
  *H10N 30/20* (2023.01)

(52) U.S. Cl.
  CPC ....... *H10N 30/2042* (2023.02); *H10N 30/802* (2023.02)

(56) References Cited

U.S. PATENT DOCUMENTS

| | | |
|---|---|---|
| 2010/0108765 A1 | 5/2010 | Vinogradov |
| 2010/0195190 A1 | 8/2010 | Ishioka et al. |
| 2010/0276492 A1 | 11/2010 | Wang et al. |
| 2012/0206784 A1 | 8/2012 | Chan et al. |
| 2015/0062528 A1 | 3/2015 | Barre et al. |
| 2018/0210224 A1 | 7/2018 | Kilcher et al. |
| 2019/0339509 A1 | 11/2019 | Chuang et al. |

FOREIGN PATENT DOCUMENTS

| | | |
|---|---|---|
| CN | 101794021 | 8/2010 |
| CN | 102906630 | 5/2015 |
| CN | 109140278 | 1/2019 |
| CN | 110441903 | 11/2019 |
| CN | 111352178 | 6/2020 |
| CN | 112748565 | 5/2021 |
| CN | 113467072 | 10/2021 |
| JP | 2006078650 | 3/2006 |
| JP | 2009266521 | 11/2009 |
| JP | 2010039365 | 2/2010 |
| JP | 2013015613 | 1/2013 |
| JP | 2015138083 | 7/2015 |
| KR | 20070052587 | 5/2007 |
| TW | I677729 | 11/2019 |

OTHER PUBLICATIONS

Wilfried Noell et al., "Shaping light with Moems," Moems And Miniaturized Systems X, Proceedings of SPIE, vol. 7930, Feb. 2011, pp. 1-10.

Ching-Kai Lo et al., "Speckle reduction with fast electrically tunable lens and holographic diffusers in a laser projector", Optics Communications, Jan. 1, 2020, pp. 1-6.

"Office Action of China Counterpart Application", dated Nov. 3, 2023, pp. 1-9.

* cited by examiner

LIGHT HOMOGENIZING ELEMENT

CROSS-REFERENCE TO RELATED APPLICATION

This application claims the priority benefit of China application serial no. 202110318884.5, filed on Mar. 25, 2021. The entirety of the above-mentioned patent application is hereby incorporated by reference herein and made a part of this specification.

BACKGROUND

1. Technical Field

The disclosure is related to an optical element, and in particular to a light homogenizing element.

2. Description of Related Art

Although displays using lasers as the light source may have better color performance (such as having wide color gamut), the speckle of lasers can cause images to appear grainy or with local brightness unevenness, resulting in poor viewing experience for users. In order to suppress the speckle caused by the laser light source due to interference phenomenon caused by high coherence, angular diversity, polarization diversity, and wavelength diversity are the most common techniques used.

For example, solutions using the technique of wavelength diversity require multiple light sources or broadband light sources tend to increase the volume and weight of the overall mechanism, and can even reduce the performance of color gamut. On the other hand, solutions using the technique of angular diversity require movable diffusers so as to uniformize the brightness distribution of the laser light source, which can cause excessive amounts of vibration in the entire mechanism and lead to a reduction in the stability of the light path. Furthermore, none of the above solutions are applicable to wearable displays. Therefore, how to solve the speckle problem of laser light sources while ensuring the miniaturization is one of the research and development priorities of the manufacturers concerned.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the disclosure were acknowledged by a person of ordinary skill in the art.

SUMMARY

The disclosure provides a light homogenizing element having the advantages of small volume and low vibration.

Other purposes and advantages of the disclosure may be further understood from the technology features disclosed in the disclosure.

In order to achieve one or all of the above-mentioned purposes or other purposes, a light homogenizing element is proposed in an embodiment of disclosure. The light homogenizing element includes a light incident surface and at least one diffusion surface. The light homogenizing element includes a first substrate, a carrier layer, a piezoelectric film, a driving electrode, a light-transmitting layer, and multiple light diffusion microstructures. The first substrate includes a first surface and a second surface opposite to each other. The first substrate includes a first cavity, where the first cavity penetrates from the first surface to the second surface. The carrier layer is located on the first surface of the first substrate and includes a light passing region penetrating the carrier layer, the carrier layer includes a protruding structure, and the protruding structure encloses the light passing region. The piezoelectric film is located on the carrier layer. The driving electrode is located on the carrier layer and drives the piezoelectric film, where the driving electrode applies driving voltage to the piezoelectric film, such that the piezoelectric film is stretched and deformed, pulling the protruding structure to bend and deform. The light-transmitting layer is overlapped and provided on the protruding structure, and a surface of the light-transmitting layer covering the light passing region is the light incident surface. The multiple light diffusion microstructures are provided on the at least one diffusion surface, and projections of the multiple light diffusion microstructures on the light-transmitting layer are located in the light passing region.

Base on the above, the embodiments of the disclosure have at least one of the following advantages or effects. In the embodiment of disclosure, by controlling the voltage difference between the two driving electrodes to change with time, the surface shape of the light incident surface may be quickly switched in time sequence, such that the deflection direction of the light path of the light beam passing through the light homogenizing element may change along with time. In this way, when the light homogenizing element is configured in an optical device with a laser light source, it may cause the speckle of the laser light source to change in time sequence, and can effectively reduce the speckle contrast value, which helps to improve the uniformity of the brightness distribution of the light beam. In addition, with the time-dependent deformation of the light incident surface and by configuring the light diffusion microstructure, after the light beam incident on the light homogenizing element and transmitted in the optical liquid passes through the light diffusion microstructure, the diversity of the deflection angle can be further increased, and the uniformity of the brightness distribution of the light beam after passing through the light homogenizing element can be further improved.

Other objectives, features and advantages of the disclosure will be further understood from the further technological features disclosed by the embodiments of the disclosure where there are shown and described preferred embodiments of this disclosure, simply by way of illustration of modes best suited to carry out the disclosure.

BRIEF DESCRIPTION OF THE DRAWINGS

The accompanying drawings are included to provide a further understanding of the disclosure, and are incorporated in and constitute a part of the disclosure. The drawings illustrate embodiments of the disclosure and, together with the description, serve to explain the principles of the disclosure.

DESCRIPTION OF THE EMBODIMENTS

Figure 1A:
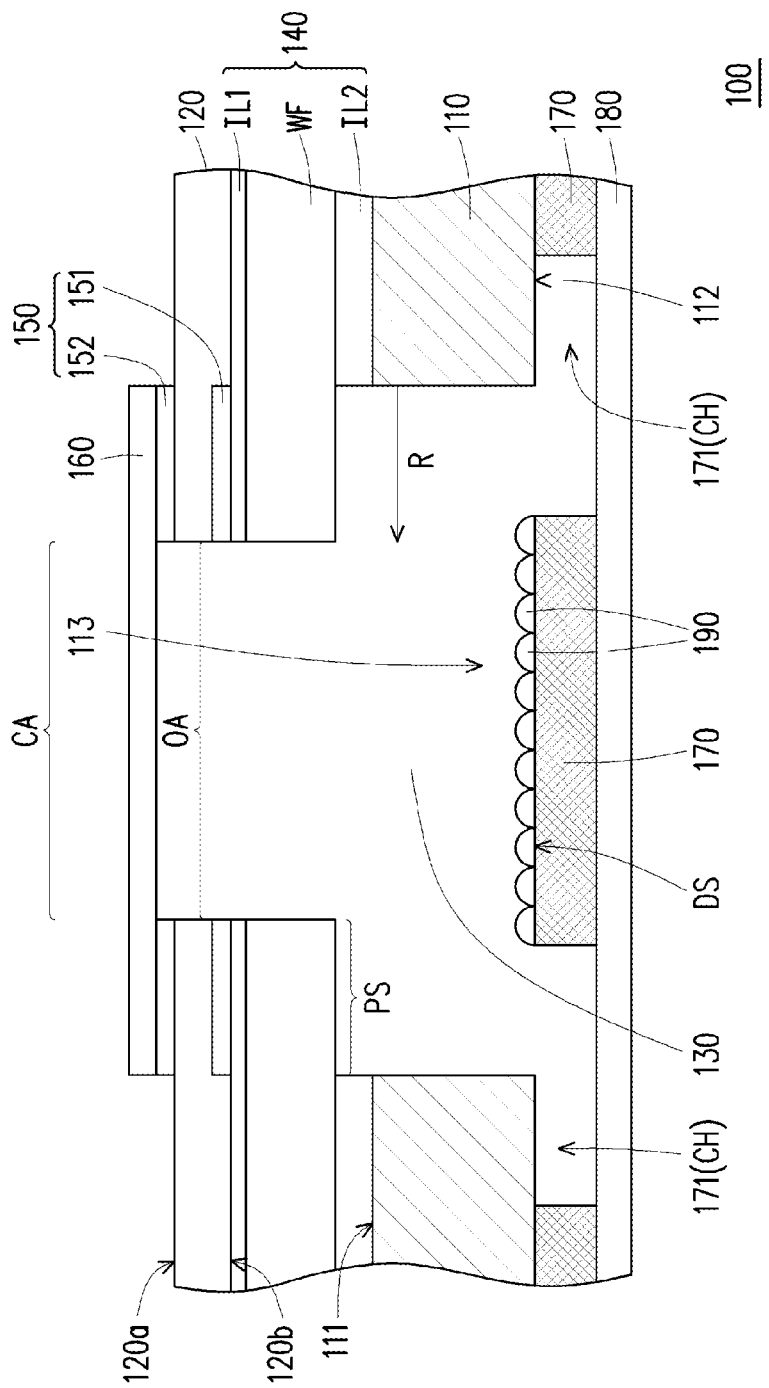
FIG. 1A is a schematic diagram of a partial cross-sectional diagram of a light homogenizing element according to an embodiment of the disclosure.

Reference will now be made in detail to the exemplary embodiments of the disclosure, examples of which are illustrated in the accompanying drawings. Whenever possible, the same reference numbers are used in the drawings and the description to refer to the same or like parts.

In the following detailed description of the preferred embodiments, reference is made to the accompanying drawings which form a part hereof, and in which are shown by way of illustration specific embodiments in which the disclosure may be practiced. In this regard, directional terminology, such as "top," "bottom," "front," "back," etc., is used with reference to the orientation of the Figure(s) being described. The components of the disclosure can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1B:
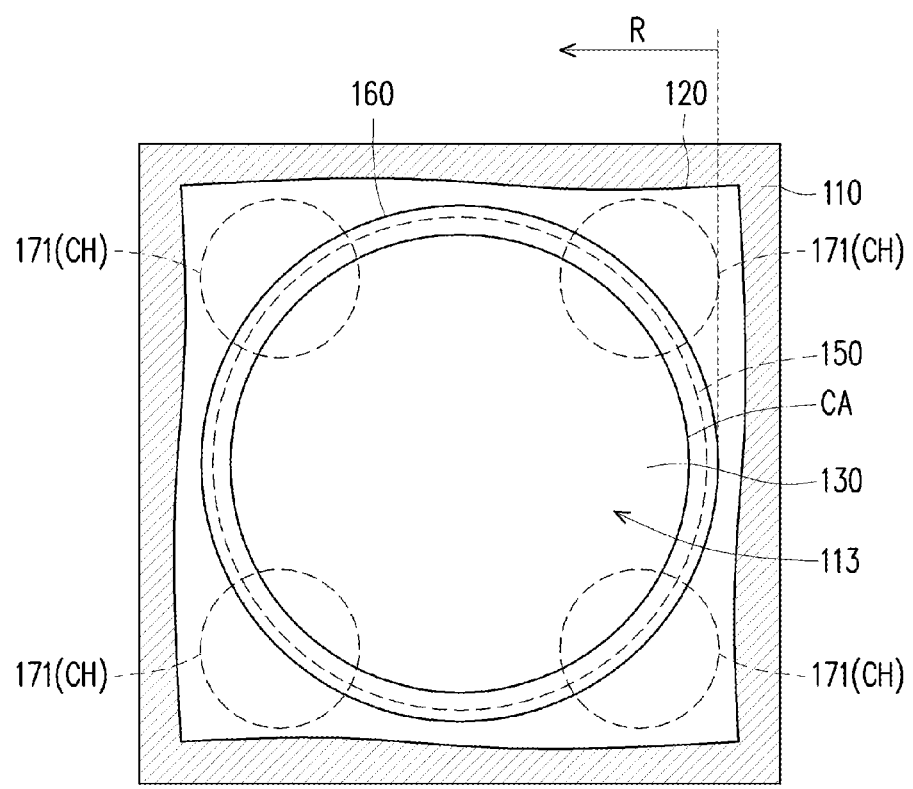
FIG. 1B is a schematic diagram of a top diagram of a light homogenizing element of FIG. 1A.
Figure 2:
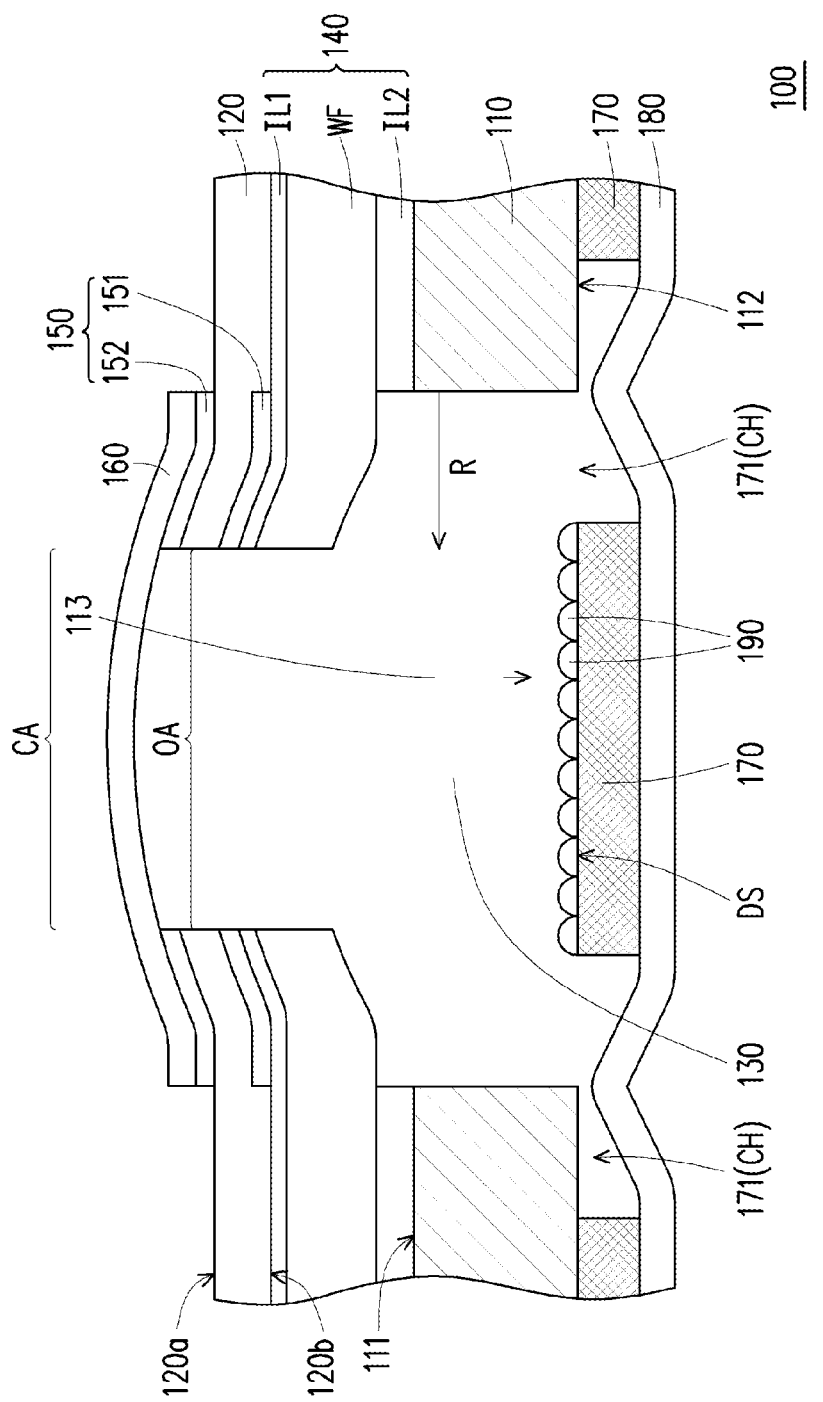
FIG. 2 is a schematic diagram of a partial cross-sectional diagram of a light homogenizing element of FIG. 1A being deformed by applying driving voltage.

FIG. 1A is a schematic diagram of a partial cross-sectional diagram of a light homogenizing element according to an embodiment of the disclosure. FIG. 1B is a schematic diagram of a top diagram of a light homogenizing element of FIG. 1A. FIG. 2 is a schematic diagram of a partial cross-sectional diagram of a light homogenizing element of FIG. 1A being deformed by applying driving voltage. Please refer to FIG. 1A. A light homogenizing element 100 of the embodiment includes a first substrate 110, a piezoelectric film 120, a carrier layer 140, a driving electrode 150, a light-transmitting layer 160, and multiple light diffusion microstructures 190. It should be noted that in order to highlight the important technology features of disclosure, the diagrams only represent schematic diagrams, and are not drawn to scale. In the embodiment, the material of the first substrate 110 may be silicon, for example, but the disclosure is not limited thereto. In the embodiment, the piezoelectric film 120 is a light-transmitting material, such as a piezoelectric film of a single crystal material, but the disclosure is not limited thereto. In other embodiments, the piezoelectric film 120 may be non-light-transmitting material. The material of the light-transmitting layer 160 may include, for example, an organic molecular material, a high molecular material, or a transparent material of glass (silicon oxide), but the disclosure is not limited thereto.

Specifically, as shown in FIG. 1A, in the embodiment, the first substrate 110 has a first surface 111 and a second surface 112 opposite to each other, and the first substrate 110 has a first cavity 113. For example, the first cavity 113 is located in the center of the first substrate 110, where the first cavity 113 penetrates through the first surface 111 and the second surface 112. In addition, in the embodiment, the light homogenizing element 100 further includes a second substrate 170. The second substrate 170 is located on the second surface 112 of the first substrate 110, where the second substrate 170 includes at least one second cavity 171. For example, as shown in FIGS. 1A and 1B, in the embodiment, at least one second cavity 171 includes multiple cylindrical cavities CH, where at least one second cavity 171 communicates with the first cavity 113 of the first substrate 110, but the disclosure is not limited thereto. In other embodiments, the second cavity 171 may be a cavity of triangular column, quadrangular column or other shapes; the disclosure is not particularly limited thereto.

Furthermore, as shown in FIG. 1A, in the embodiment, the light homogenizing element 100 further includes an optical liquid 130. The optical liquid 130 is configured to fill the first cavity 113, and the optical liquid 130 also fills the at least one second cavity 171. In the embodiment, the light homogenizing element 100 further includes an elasticity film 180; the second substrate 170 is located between the elasticity film 180 and the second surface 112 of the first substrate 110; and the elasticity film 180 covers the second substrate 170 and at least one second cavity 171, so as to seal the optical liquid 130. On the other hand, the light-transmitting layer 160 is located on the first surface 111 of the first substrate 110, and the optical liquid 130 filling the first cavity 113 and the second cavity 171 directly contacts the light-transmitting layer 160 and the elasticity film 180. In the embodiment, the material of the optical liquid 130 may be a transparent material that may be known to those having ordinary skill in the art, which will not be repeated herein. The material of the second substrate 170 may be, for example, glass, and the material of the elasticity film 180 may be, for example, Parylene or Polydimethylsiloxane (PDMS), but the disclosure is not limited thereto.

On the other hand, as shown in FIG. 1A, in the embodiment, the carrier layer 140 is located on the first surface 111 of the first substrate 110. More specifically, as shown in FIG. 1A, in the embodiment, the carrier layer 140 includes a first insulation layer IL1, a second insulation layer IL2, and a wafer layer WF. The second insulation layer IL2 and the first insulation layer IL1 are provided overlapped. A wafer layer WF is located between the first insulation layer IL1 and the second insulation layer IL2. For example, in the embodiment, the material of the wafer layer WF may be silicon, and the material of the first insulation layer IL1 and the second insulation layer IL2 may be silicon oxide, for example. Thus, the carrier layer 140 can be easily manufactured using the process technology of silicon-on-insulator (SOI), and may be integrated with the existing process technology.

As shown in FIG. 1A and FIG. 1B, in the embodiment, the carrier layer 140 includes a light passing region CA that penetrates the carrier layer 140. Furthermore, the carrier layer 140 encloses a protruding structure PS, and the protruding structure PS encloses the light passing region CA. The protruding structure PS extends from the first surface 111 of the first substrate 110 to a center of the light passing region CA in a radial direction R of the light passing region CA. That is, the carrier layer 140 completely covers the first surface 111 of the first substrate 110 and extends to the center of the light passing region CA, and the extended part is the protruding structure PS. In other words, a projection area of the light passing region CA in the elasticity film 180 is smaller than a projection area of the first cavity 113 in the elasticity film 180. Specifically, in the embodiment, the protruding structure PS of the carrier layer 140 is made up of the wafer layer WF and the first insulation layer IL1 (that is, a boundary of the second insulation layer IL2 is the same as a boundary of the first substrate 110), but the disclosure is not limited thereto. In other embodiments, the carrier layer 140 may be a single-layer structure. The carrier layer 140 may extend to the center of the light passing region CA to form the protruding structure PS. The carrier layer 140 may be, for example, an insulation layer or a semiconductor layer.

As shown in FIG. 1A, the piezoelectric film 120 is located on the carrier layer 140, where the piezoelectric film 120 is provided on the first insulation layer IL1, and the light-transmitting layer 160 is located on the piezoelectric film 120. However, the disclosure is not limited thereto. In other embodiments, the light-transmitting layer 160 may also be provided between the piezoelectric film 120 and the carrier layer 140, or the piezoelectric film 120 and the light-transmitting layer 160 may be formed by other stacking methods. The piezoelectric film 120 has an opening region OA, and a boundary of the opening region OA is the same as a boundary of the light passing region CA, but the disclosure is not limited thereto. In other embodiments, a projection area of the opening region OA of the piezoelectric film 120 in the elasticity film 180 may be greater than or equal to a projection area of the light passing region CA in the elasticity film 180. As shown in FIG. 1A, in the embodiment, the light-transmitting layer 160 is provided overlapping on the piezoelectric film 120 and the protruding structure PS of the carrier layer 140, and the light-transmitting layer 160 covers the light passing region CA.

More specifically, referring to both FIG. 1A and FIG. 1B, in the embodiment, a projection range of the light-transmitting layer 160 on the elasticity film 180 completely covers a projection range of the light passing region CA on the elasticity film 180. The projection region of the light passing region CA on the elasticity film 180 overlaps the projection region of the first cavity 113 on the elasticity film 180. Furthermore, as shown in FIG. 1B, in the embodiment, the projection region of the first cavity 113 on the elasticity film 180 at least partially overlaps the projection region of at least one second cavity 171 on the elasticity film 180. In particular, a projection range of the second cavity 171 on the elasticity film 180 does not overlap a projection range of the light passing region CA on the elasticity film 180. In this way, it can be ensured that the disposition of the second cavity 171 will not affect the optical performance of the light passing through the light passing region CA.

Next, proceeding to refer to FIG. 1A and FIG. 1B, in the embodiment, the driving electrode 150 is located on the carrier layer 140 and is configured to drive the piezoelectric film 120. For example, as shown in FIG. 1A, in the embodiment, the piezoelectric film 120 is sandwiched by the corresponding driving electrode 150 respectively. The driving electrode 150 includes a driving electrode 151 and a driving electrode 152, where the driving electrode 151, the piezoelectric film 120, and the driving electrode 152 are sequentially stacked on the carrier layer 140 from bottom to top. In more detail, as shown in FIG. 1A, in the embodiment, the piezoelectric film 120 includes an exterior surface 120a and an inner surface 120b opposite to each other. The exterior surface 120a faces the light-transmitting layer 160, and the inner surface 120b faces the carrier layer 140. The driving electrode 151 is located between the carrier layer 140 and the inner surface 120b of the piezoelectric film 120. The driving electrode 152 is located between the exterior surface 120a of the piezoelectric film 120 and the light-transmitting layer 160. For example, the materials of the driving electrode 151 and the driving electrode 152 may be platinum and gold, respectively. Moreover, as shown in FIG. 1B, the shape of the driving electrode 150 may be a ring, and the driving electrode 150 surrounds the light passing region CA.

In this way, when the driving electrode 150 applies a driving voltage to the piezoelectric film 120, the piezoelectric film 120 is deformed by compression or stretching (for example, the piezoelectric film 120 is compressed or stretched in the direction parallel to the first substrate 110) by an electric field, pulling the protruding structure PS to bend and deform (for example, the protruding structure PS bends or stretches in a direction parallel to a normal line of the first substrate 110) and driving the light-transmitting layer 160 into deformation, so as to achieve the purpose of optical zooming. In the embodiment, the piezoelectric film 120 is deformed by the electric field, such that both the protruding structure PS of the carrier layer 140 and the light-transmitting layer 160 are deformed by force. Moreover, because the protruding structure PS of the carrier layer 140 has a higher elasticity coefficient, the structural strength of the light-transmitting layer 160 with a smaller elasticity coefficient can be enhanced. As a result, as the electric field changes, the light-transmitting layer 160 may be bent away from the first cavity 113 or towards the first cavity 113 to form a convex spherical or a concave spherical surface deformation so as to achieve the purpose of zooming.

On the other hand, in the embodiment, the elasticity coefficient of the elasticity film 180 is smaller than the elasticity coefficient of the light-transmitting layer 160. Thus, by disposing the elasticity film 180 having the relatively small elasticity coefficient, volume change of the light homogenizing element when the light-transmitting layer 160 is deformed can be moderated, such that the light-transmitting layer 160 located in the light passing region CA can still maintain an approximate spherical shape when a driving voltage is applied to the piezoelectric film 120, thereby effectively maintaining the optical quality of the light homogenizing element 100.

For example, in the embodiment, the lengths and widths of the first substrate 110, the light-transmitting layer 160, the second substrate 170, and the elasticity film 180 are all approximately 3-13 mm, and the thicknesses of the first substrate 110, the light-transmitting layer 160, the second substrate 170, and the elasticity film 180 are approximately 10 micrometer, 25 micrometer, 300 micrometer, and 10 micrometer, respectively. The diameter of the first cavity 113 is approximately 4 mm, and the diameter of the second cavity 171 is approximately 1.8 mm. It should be noted that the numerical range here is for illustrative purposes only, and is not used to limit the disclosure.

On the other hand, in the embodiment, an outer diameter of the driving electrode 150 is approximately 2-10 mm, an inner diameter is approximately 0.5-6 mm, a diameter of the light passing region CA is approximately 0.5-6 mm, and a size of the protruding structure PS of the carrier layer 140 is approximately 0.5-4 mm. In particular, according to the size change of the protruding structure PS, the elasticity coefficient also changes, and the degree of protruding of the light-transmitting layer 160 will also vary. Thus, when the driving electrode 150 applies an appropriate driving voltage to the piezoelectric film 120, the tensile force causing the piezoelectric film 120 to deform will keep the protruding structure PS and the light-transmitting layer 160 to deform within a desired range. Thus, under such configuration, by the strain action of the optical liquid 130, the piezoelectric film 120, the protruding structure PS of the carrier layer 140, and the light-transmitting layer 160, the light homogenizing element 100 may adjust the curve radius of the light-transmitting layer 160 in the light passing region CA so as to achieve the effect of zooming. The following provides further explanation with reference to FIG. 2.

FIG. 2 is a schematic diagram of a partial cross-sectional diagram of a light homogenizing element 100 of FIG. 1A by applying driving voltage. Specifically, as shown in FIG. 2, a driving voltage is applied to the piezoelectric film, driving the light-transmitting layer 160 into deformation. The carrier layer 140, the piezoelectric film 120, the driving electrode 150, and the light-transmitting layer 160 may together enclose a zoomable cavity; and the zoomable cavity may communicate with the first cavity 113. In particular, since the thicknesses of the piezoelectric film 120 and the driving electrode 150 may be much smaller than the thickness of the carrier layer 140, the region enclosed by the light passing region CA and the light-transmitting layer 160 may also be directly taken as a zoomable cavity. Furthermore, the range of the first cavity 113 will change due to the deformation of the carrier layer 140, but the zoomable cavity may still communicate the first cavity 113.

In the embodiment, when the light-transmitting layer 160 is deformed, since the first cavity 113, the second cavity 171, and the zoomable cavity enclose a sealed space, the volume of the optical liquid 130 filling in the cavity remains constant, the optical liquid 130 will flow in the first cavity 113, the second cavity 171, and the zoomable cavity. Since the elasticity coefficient of the elasticity film 180 is much smaller than the elasticity coefficient of the light-transmitting layer 160, volume change of the light homogenizing element when the light-transmitting layer 160 deforms can be adjusted. At this time, the elasticity film 180 covering the second cavity 171 and the second substrate 170 at this time will also be deformed, such that the optical liquid 130 may flow smoothly without causing unwanted deformation. In other words, without providing the elasticity film 180, unwanted deformation degree of the light-transmitting layer 160 may occur. With the disposition of the elasticity film 180, the shape of the light-transmitting layer 160 can be deformed to within the expected degree and the optical quality of the light homogenizing element 100 can be maintained. Thus, by disposing the elasticity film 180 having relatively small elasticity coefficient, the light-transmitting layer 160 located in the light passing region CA can still maintain an approximate spherical shape when a driving voltage is applied, thereby effectively maintaining the optical quality of the light homogenizing element 100.

In the embodiment, the cross-sectional profile of the deformed light-transmitting layer 160 is a convex curve from the first surface 111 of the first substrate 110, and the curvature of the curve may be controlled by the voltage difference applied by the driving electrode 151 and the driving electrode 152. In other words, the surface shape of the light incident surface (i.e. the surface of the light-transmitting layer 160) of the light homogenizing element 100 may be changed by the voltage difference between the two driving electrodes. For example, in the disclosure, the driving voltage ranges between 0 and 50 volts, but the disclosure is not limited thereto.

Furthermore, in the embodiment of disclosure, when controlling the voltage difference between the two driving electrodes to change with time, the surface shape of the light incident surface may be quickly switched in time sequence, such that the deflection direction of the light path of the light beam passing through the light-transmitting layer 160 of the light homogenizing element may change along with time. In this way, when the light homogenizing element is configured in an optical device with a laser light source, it may cause the speckle of the light source to change in time sequence, and can effectively reduce the speckle contrast value, which helps to improve the uniformity of the brightness distribution of the light beam.

It is worth mentioning that the light homogenizing element 100 of the embodiment drives the light incident surface into deformation by the piezoelectric effect, with a response rate of more than tens of kilohertz (kHz), and may adopt micro mechanical system (MEMS) for manufacturing. In other words, the light homogenizing element 100 of the embodiment has the advantages of fast response, silent movement, and microformability. Although the embodiment adjust the surface shape of the light incident surface of the light homogenizing element 100 with the principle of piezo-electricity, but the disclosure is not limited thereto. In other embodiment, the light homogenizing element may adjust the surface shape of the light incident surface by using electromagnetic coil or electroactive polymer.

Furthermore, as shown in FIGS. 1A and 2, the light homogenizing element 100 further includes at least one diffusion surface DS, and part of the optical liquid 130 is located between the light incident surface (that is, the surface of the light-transmitting layer 160) and at least one diffusion surface DS. The multiple the light diffusion microstructures 190 of the light homogenizing element 100 are provided on the at least one diffusion surface, and projections of the multiple light diffusion microstructures 190 on the light-transmitting layer 160 are located in the light passing region CA, and do not overlap with the second cavity 171. In other words, the light diffusion microstructures 190 are provided on the transmission path of the light beam passing through the light homogenizing element 100. More specifically, in the embodiment, at least one diffusion surface DS is part of a surface of the second substrate 170 that contacts the optical liquid 130, a projection of the part of the surface on the light-transmitting layer 160 is located in the light passing region CA, and the optical liquid 130 contacts the multiple light diffusion microstructures 190. In this way, after the light beam incident from the light-transmitting layer 160 and transmitted in the optical liquid 130 passes through the diffusion surface DS where the light diffusion microstructures 190 are located, the diversity of the deflection angle can be further increased. In other words, with the temporal deformation of the light incident surface and by configuring the light diffusion microstructures 190 on the diffusion surface DS, the uniformity of the brightness distribution of the light beam passing through the light homogenizing element can be further improved.

In the embodiment, the light diffusion microstructure 190 is, for example, a periodic structure in the form of microlens, but the disclosure is not limited thereto. In other embodiment, the light diffusion microstructure 190 may also be a periodic structure in the form of micro prism or micro pyramid, or is embodied by a surface microstructure similar to a diffraction optical element (DOE) or a diffuser with a diffusion particle.

The following will list some other embodiments to explain the disclosure in detail, the same component will be marked with the same sign, and the description of the same technology content of omit, reference can be made to the aforementioned embodiment for omitted parts, and will not be repeated below.

Figure 3:
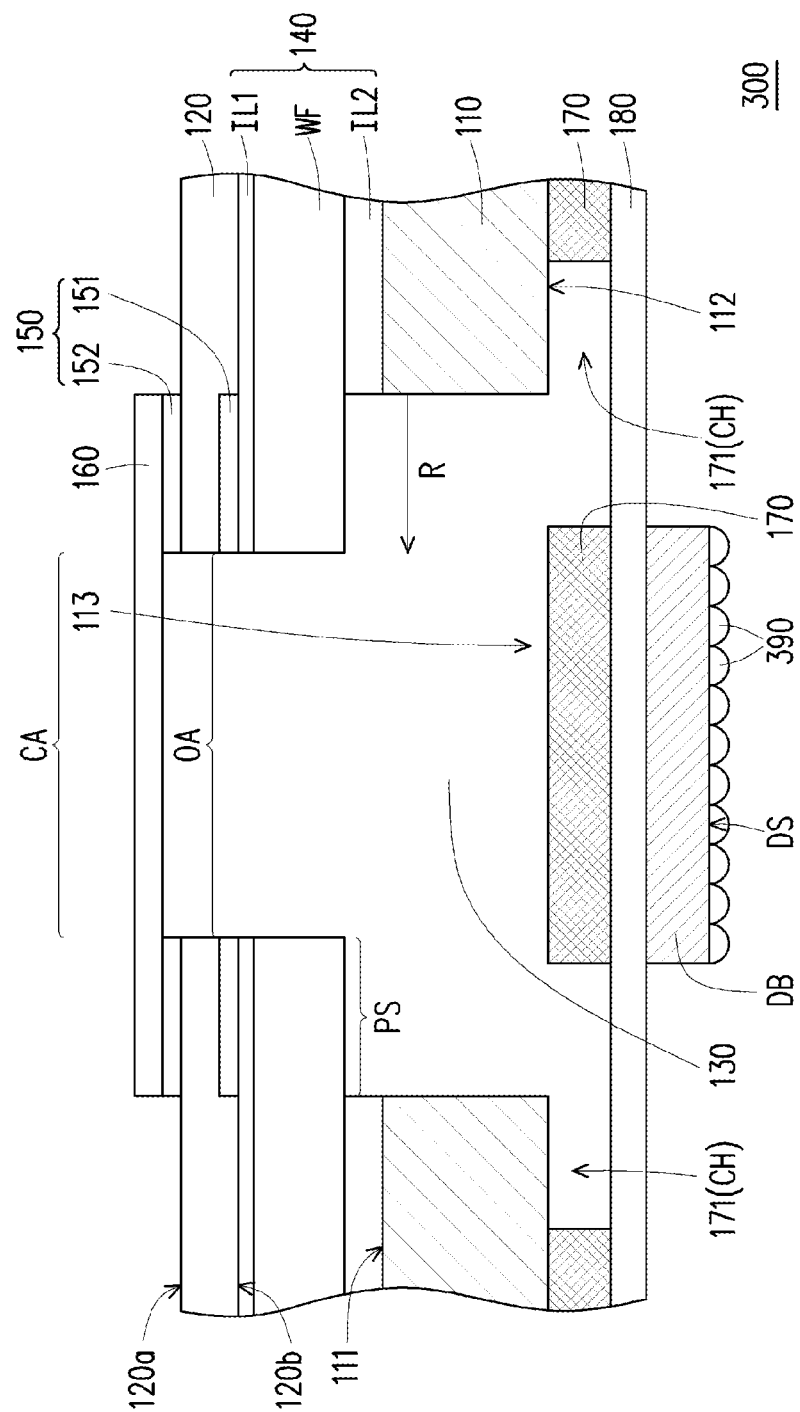
FIG. 3 is a partial sectional schematic diagram of another light homogenizing element according to an embodiment of the disclosure.

FIG. 3 is a partial sectional schematic diagram of another light homogenizing element according to an embodiment of the disclosure. Referring to FIG. 3, the light homogenizing element 300 of the embodiment is similar to the light homogenizing element 100 of FIG. 1, and the differences between the two are as follows. The main difference is: the configuration position of light diffusion microstructures 390 of the light homogenizing element 300 is different from the configuration position of the light diffusion microstructures 190 of the light homogenizing element 100. Specifically, the light diffusion microstructures 390 of the light homogenizing element 300 are provided on a side of the elasticity film 180 away from the second substrate 170, and the diffusion surface DS faces away from the second substrate 170. In other words, the elasticity film 180 of the embodiment is located between the light diffusion microstructures 390 and the second substrate 170. Moreover, the light homogenizing element 300 may also selectively include a third substrate DB. The third substrate DB is disposed between the elasticity film 180 and the light diffusion microstructures 390, and the projection on the light-transmitting layer 160 is located in the light passing region CA.

More specifically, the light diffusion microstructures 390 are provided on a surface of the third substrate DB away from the elasticity film 180 (i.e. the diffusion surface DS). In the embodiment, the material of the third substrate DB may include polyimide (PI), polymethyl methacrylate (PMMA), polyethylene terephthalate (PET), or polycarbonate (PC), but the disclosure is not limited thereto.

Specifically, as shown in FIG. 3, the third substrate DB is only provided in the light passing region CA of the light homogenizing element 300, and does not overlap the second cavity 171 in the direction perpendicular to the light incident surface. In other words, the third substrate DB provided with the light diffusion microstructures 390 does not contact the part of the elasticity film 180 covering the second cavity 171. However, the disclosure is not limited thereto. In other embodiments, a gap may also be provided between the third substrate DB disposed with the light diffusion microstructures 390 and the elasticity film 180. For example, the diffuser plate may be provided on a fixed mechanism or gel, such that a predetermined pitch from the elasticity film 180 is maintained.

Similar to the light diffusion microstructures 190, the light diffusion microstructures 390 also overlap the first cavity 113 in the direction perpendicular to the light incident surface. In other words, the light diffusion microstructures 390 are provided on the transmission path of the light beam passing through the light homogenizing element 300. Therefore, after the light beam incident from the light-transmitting layer 160 and transmitted in the optical liquid 130 passes through the diffusion surface DS where the light diffusion microstructures 390 are located, the diversity of the deflection angle can be further increased. In other words, with the temporal deformation of the light incident surface of the light homogenizing element 300 and by configuring the light diffusion microstructures 390 on the diffusion surface DS, the uniformity of the brightness distribution of the light beam passing through the light homogenizing element 300 can be further improved.

Figure 4:
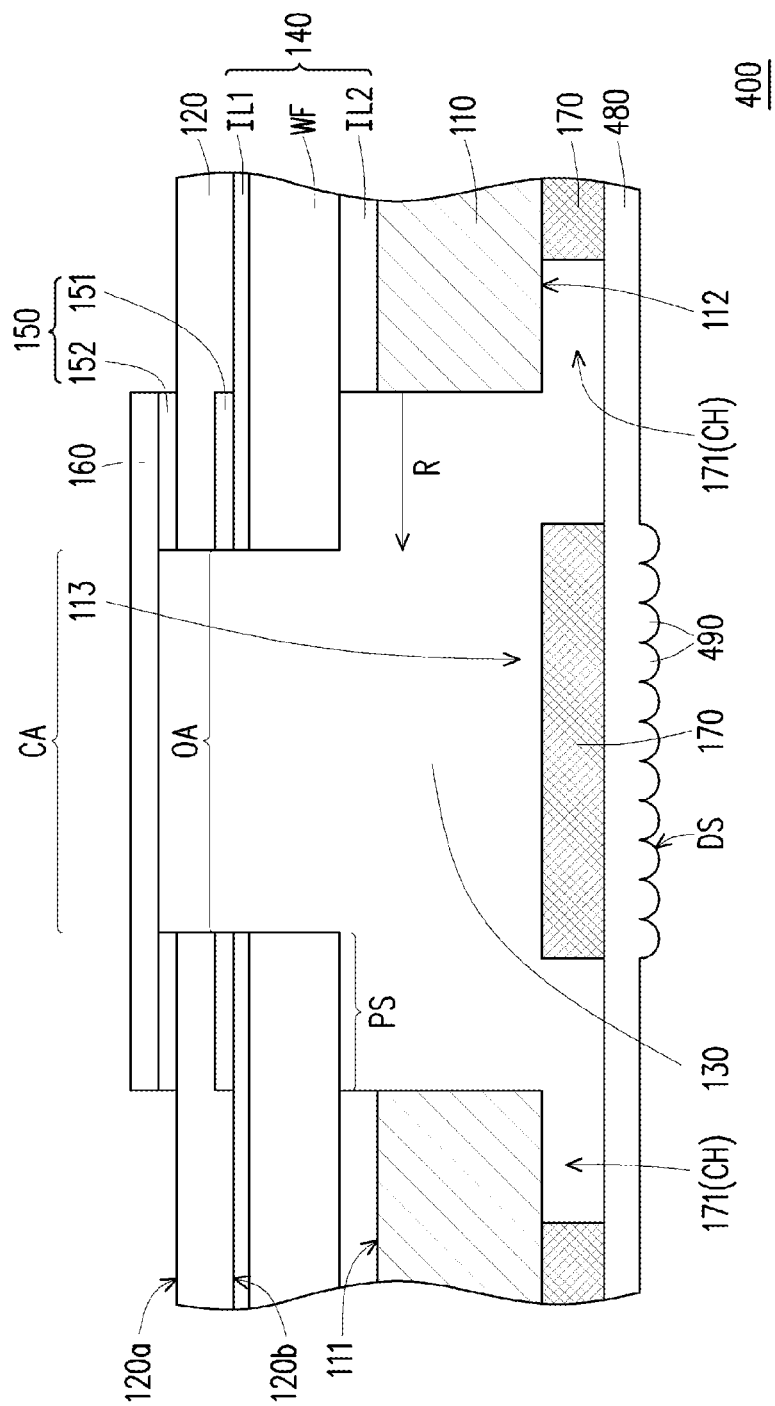
FIGS. 4 to 6 are partial sectional schematic diagrams of different light homogenizing elements of an embodiment according to the disclosure.
Figure 5:
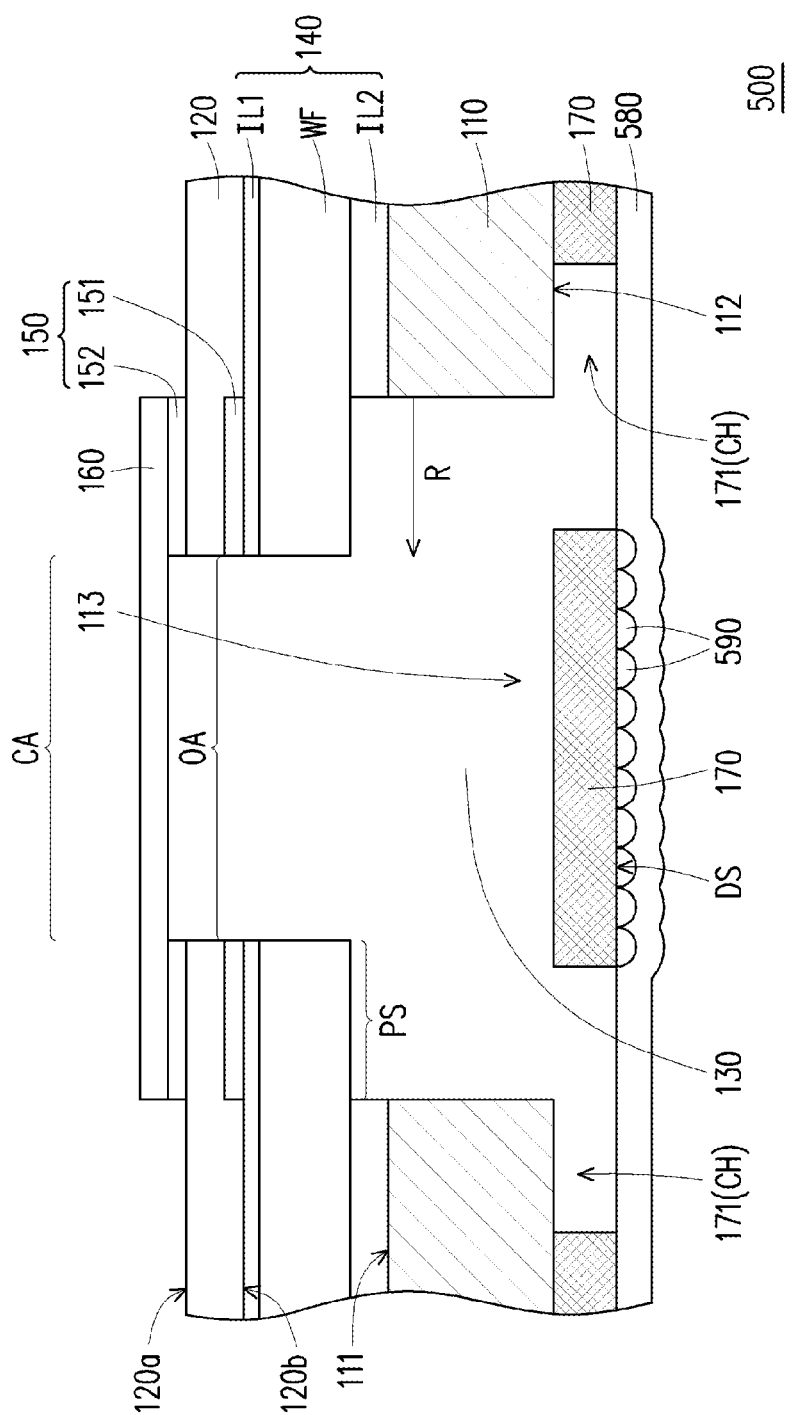
Figure 6:
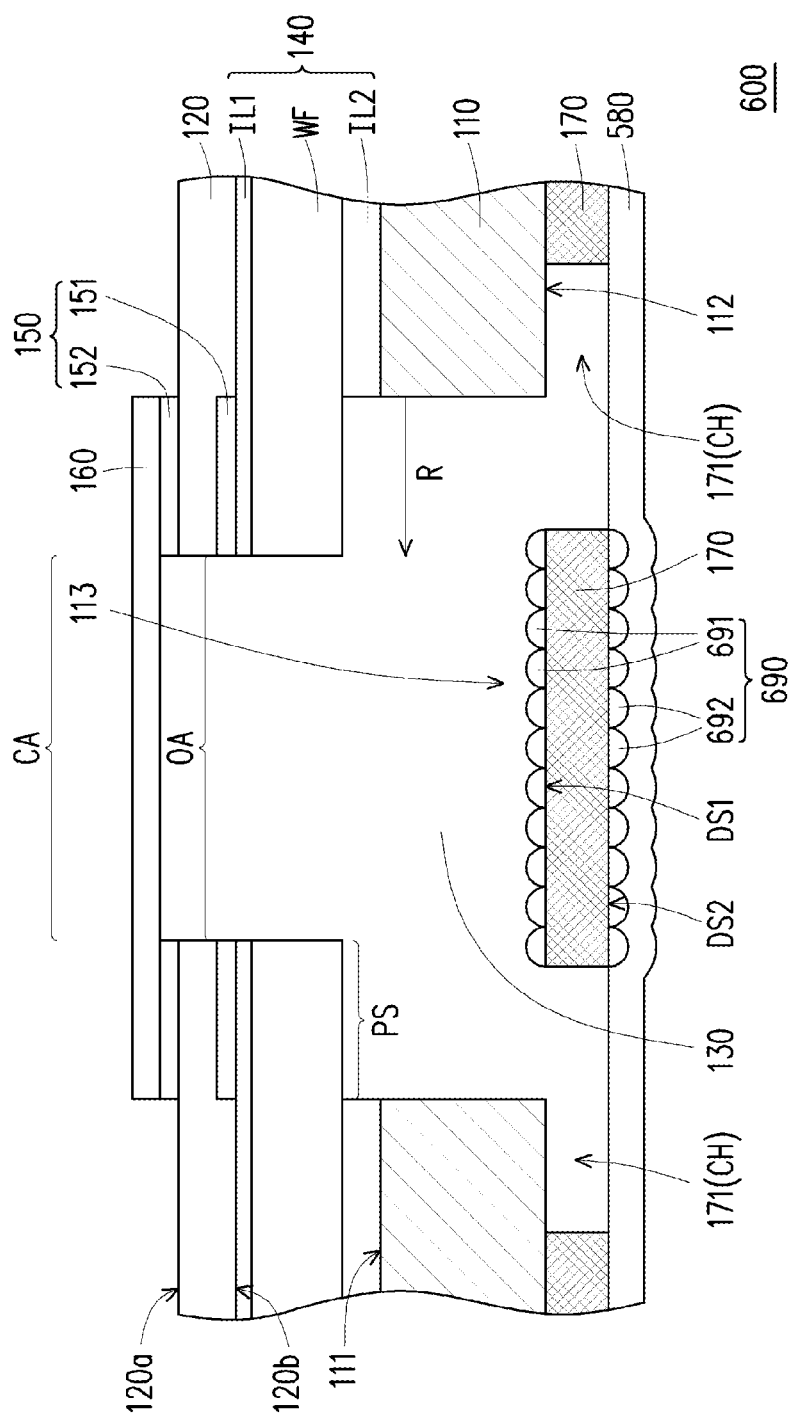

FIGS. 4 to 6 are partial sectional schematic diagrams of different light homogenizing elements according to an embodiment of the disclosure. Referring to FIGS. 4 to 6, a light homogenizing element 400, a light homogenizing element 500, and a light homogenizing element 600 of the embodiment is similar to the light homogenizing element 100, and the difference is as follows. The main difference is: the configuration positions of light diffusion microstructures 490, light diffusion microstructures 590, and light diffusion microstructures 690 of the light homogenizing element 400 are different from the configuration position of the light diffusion microstructures 190 of the light homogenizing element 100.

Specifically, as shown in FIG. 4, in the embodiment of FIG. 4, at least one diffusion surface DS of the light homogenizing element 400 is a microstructure surface of an elasticity film 480 located in the light passing region CA. The microstructure surface faces away from the second substrate 170; that is, the diffusion surface DS faces away from the second substrate 170. More specifically, the multiple light diffusion microstructures 490 and the elasticity film 480 of the embodiment are integrally formed, and the diffusion surface DS may be formed by the multiple light diffusion microstructures 490.

On the other hand, as shown in FIG. 5, in the embodiment of FIG. 5, the multiple light diffusion microstructures 590 of the light homogenizing element 500 are located between the second substrate 170 and an elasticity film 580. The at least one diffusion surface DS is part of a surface of the second substrate 170 that contacts the elasticity film 580. The elasticity film 580 directly covers the multiple light diffusion microstructures 590.

As shown in FIG. 6, in the embodiment of FIG. 6, some of the multiple light diffusion microstructures 690 are located on one side of the second substrate 170, and the other of the multiple light diffusion microstructures 690 are located on the other side of the second substrate 170, and are disposed corresponding to the some of the multiple light diffusion microstructures 690. In other words, the light homogenizing element 600 has two diffusion surfaces. For example, the multiple light diffusion microstructures 690 of the light homogenizing element 600 includes multiple first light diffusion microstructures 691 and multiple second light diffusion microstructures 692. The first light diffusion microstructures 691 and the second light diffusion microstructures 692 are provided on a first diffusion surface DS1 and a second diffusion surface DS2, respectively. The first diffusion surface DS1 is part of a surface of the second substrate 170 contacting the optical liquid 130, and the second diffusion surface DS2 is part of a surface of the second substrate 170 contacting the elasticity film 580.

In this way, in the embodiments of the FIGS. 4 to 6, after the light beam incident from the light-transmitting layer 160 and transmitted in the optical liquid 130 passes through the light diffusion microstructures 490, the light diffusion microstructures 590, and the light diffusion microstructures 690, the diversity of the deflection angle can be further increased. In other words, with the temporal deformation of the light incident surface and by configuring the light diffusion microstructures 490, the light diffusion microstructures 590, and the light diffusion microstructures 690, the uniformity of the brightness distribution of the light beam after passing through the light homogenizing element 400, light homogenizing element 500, and light homogenizing element 600 can be effectively improved.

Figure 7A:
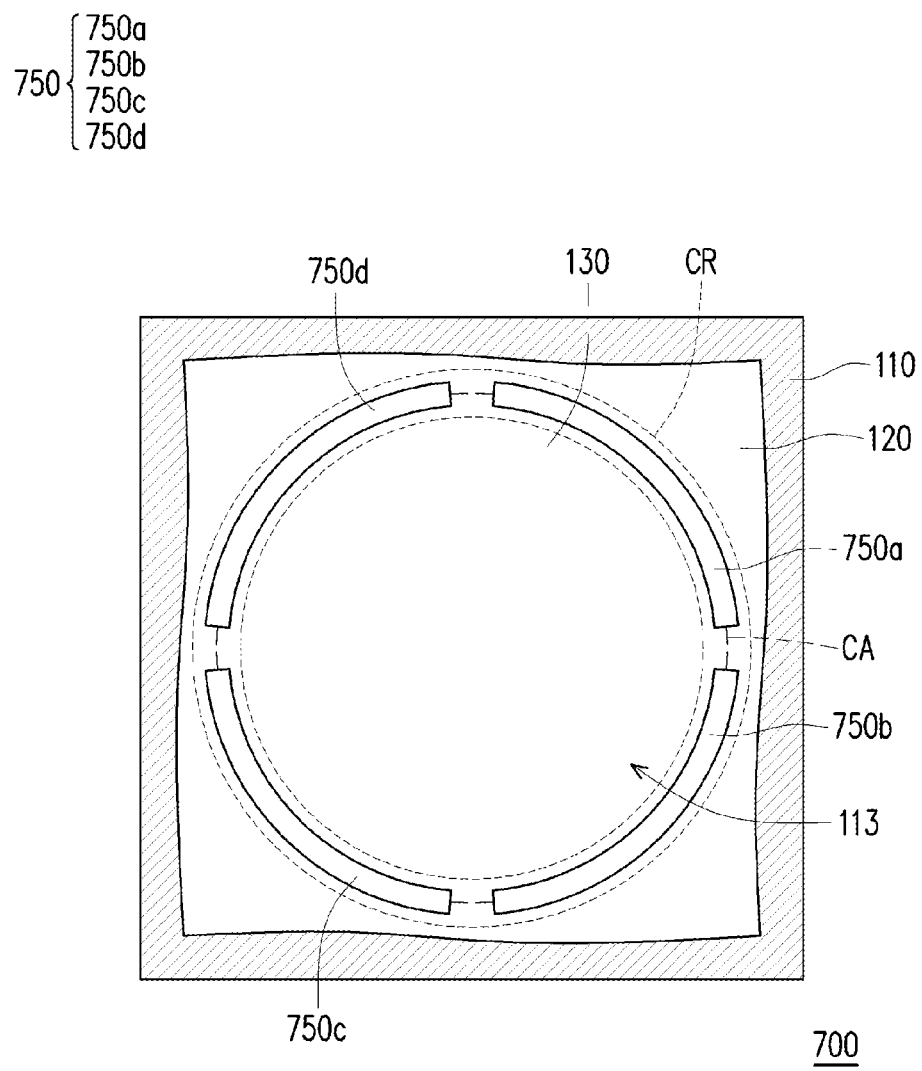
FIG. 7A is a schematic diagram of another light homogenizing element according to an embodiment of the disclosure.
Figure 7B:
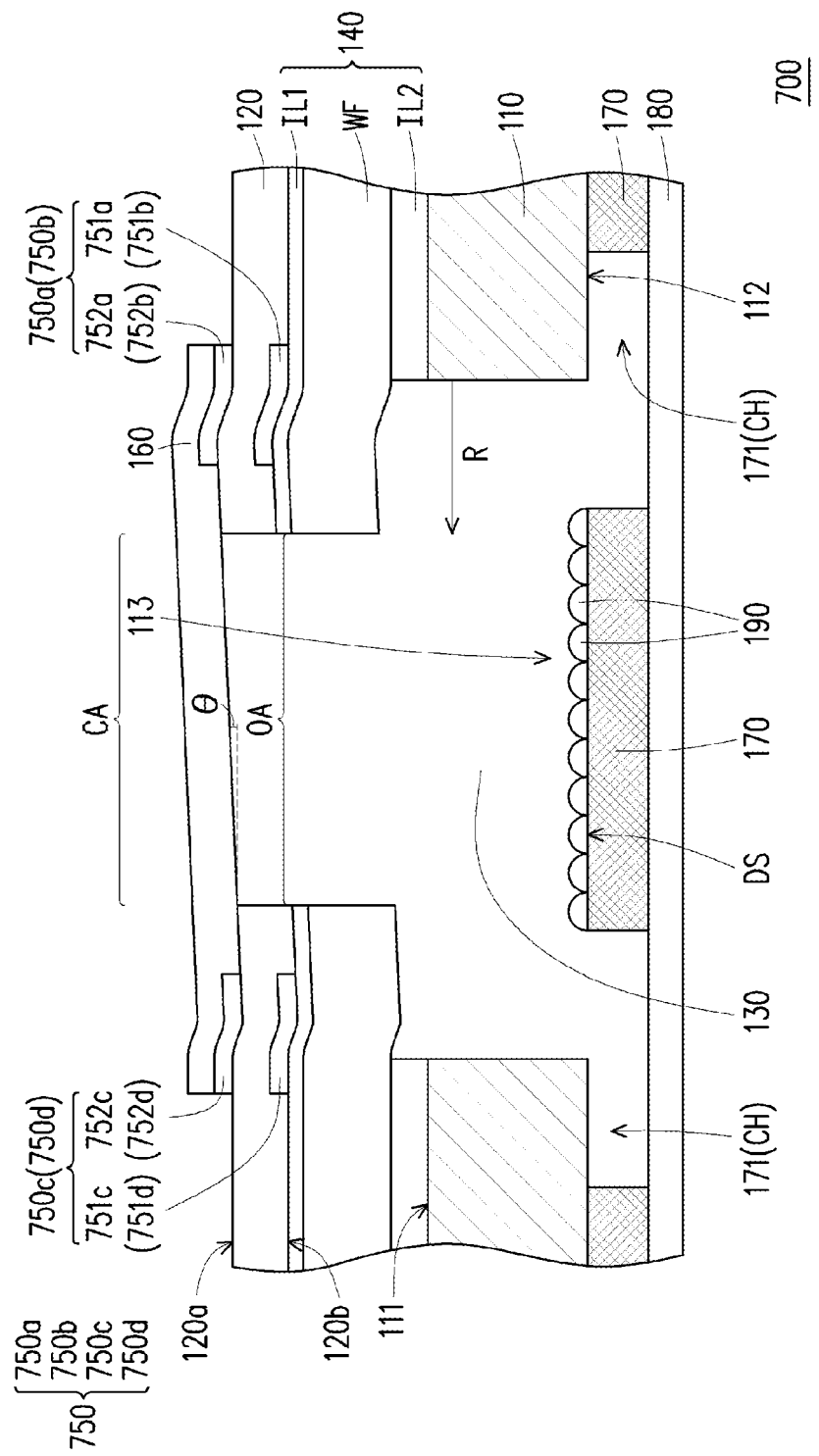
FIG. 7B is a partial sectional schematic diagram of a light homogenizing element of FIG. 7A.

FIG. 7A is a schematic diagram of another light homogenizing element according to an embodiment of the disclosure. FIG. 7B is a partial sectional schematic diagram of a light homogenizing element of FIG. 7A. Referring to FIGS. 7A and 7B, a light homogenizing element 700 of the embodiment is similar to the light homogenizing element 100 of FIG. 1, and the differences between the two are as follows. The main differences are the configuration of the driving electrode and the driving method. Specifically, as shown in FIGS. 7A and 7B, in the embodiment, the driving electrode 750 includes multiple arc-shaped electrodes 750a, 750b, 750c, 750d, and the arc-shaped electrodes 750a, 750b, 750c, 750d are arranged on a circular region CR. The circular region CR surrounds the light passing region CA, and the arc-shaped electrodes 750a, 750b, 750c, and 750d are provided on the exterior surface 120a of the piezoelectric film 120 by surrounding the first cavity 113, and are separated from each other. The arc-shaped electrode 750a (the arc-shaped electrode 750b, the arc-shaped electrode 750c, or the arc-shaped electrode 750d) further includes a driving electrode 751a (a driving electrode 751b, a driving electrode 751c, a driving electrode 751d) and a driving electrode 752a (a driving electrode 752b, a driving electrode 752c or a driving electrode 752d). The driving electrode 751a (the driving electrode 751b, the driving electrode 751c, or the driving electrode 751d), the piezoelectric film 120, the driving electrode 752a (the driving electrode 752b, the driving electrode 752c or the driving electrode 752d) are sequentially stacked on the carrier layer 140 from bottom to top. Moreover, in the embodiment, the polarity direction of the driving voltage applied by any of the arc-shaped electrodes 750a, 750b, 750c, and 750d is opposite to the polarity direction of the driving voltage applied by an adjacent arc-shaped electrode. For example, the polarity direction of the driving voltage applied by the arc-shaped electrode 750a is opposite to the polarity direction of the driving voltage applied by the arc-shaped electrode 750b. For example, with the time-sharing driving of the driving electrodes, the piezoelectric film 120 of the embodiment may cause the surface of the light-transmitting layer 160 to form a planar inclination on the first surface 111 of the first substrate 110, and the planar inclination angle may change along with time. In the embodiment, an angle θ between the light incident surface and the first surface 111 of the first substrate 110 (i.e. the inclination angle) may range between 0.5 degrees to 20 degrees, but the disclosure is not limited thereto.

In this way, by quickly switching the inclination angle of the light incident surface in time sequence, the deflection direction of the light path of the light beam coming from the light source (such as laser light source) after passing through the light-transmitting layer 160 of the light homogenizing element 700 can also change along with time. Also as a result, with the change of the speckle of the laser light source in time sequence, the speckle contrast can be effectively reduced, which helps to improve the uniformity of the brightness distribution of the light beam.

Figure 8:
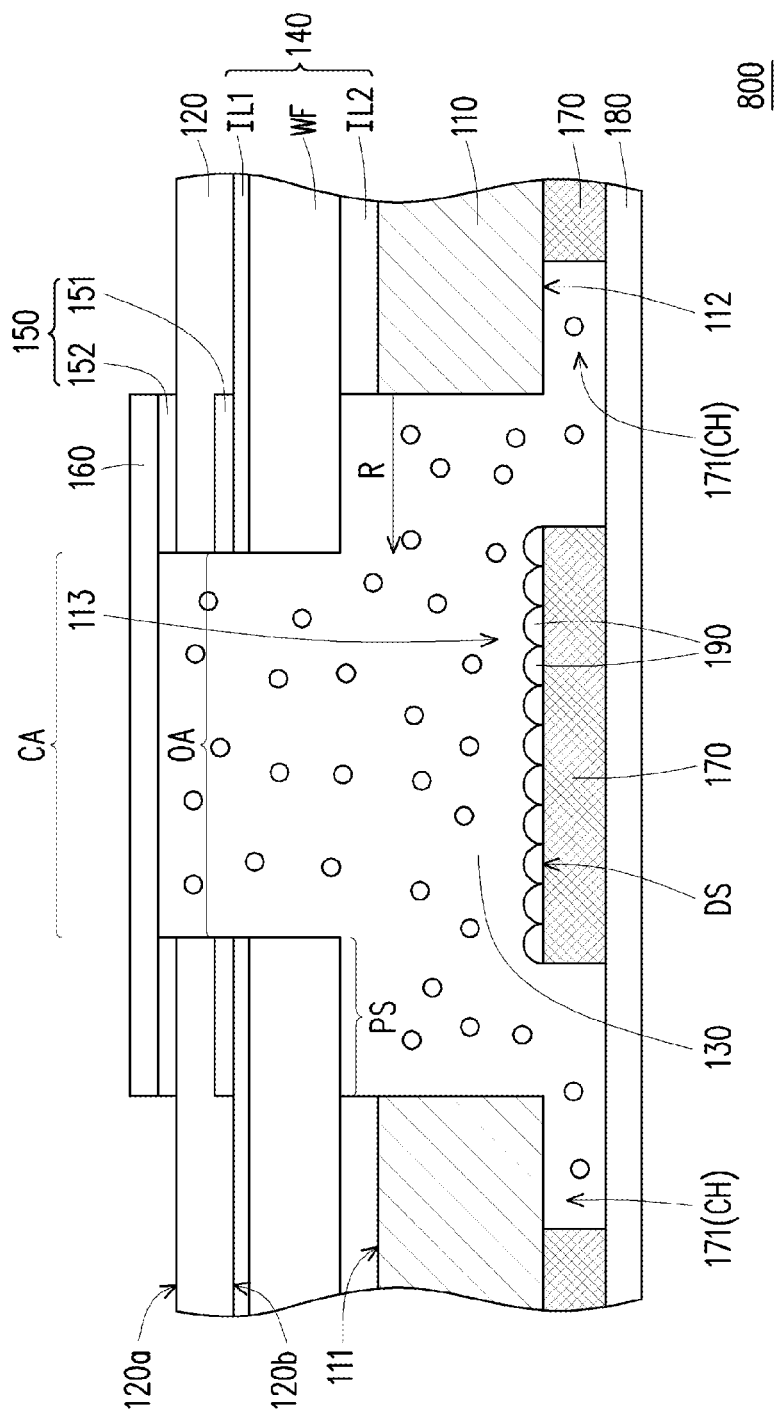
FIG. 8 is a schematic diagram of a partial top diagram of another light homogenizing element according to an embodiment of the disclosure.

FIG. 8 is a partial sectional schematic diagram of another light homogenizing element according to another embodiment of the disclosure. Referring to FIG. 8, a light homogenizing element 800 of the embodiment is similar to the light homogenizing element 100 of FIG. 1, and the difference the two is as follows. The main difference lies in that the light homogenizing element 800 further includes multiple optical particles PA. Specifically, as shown in FIG. 8, in the embodiment, the optical particles PA are provided dispersed in the optical liquid 130, and the refractive index of the optical particles PA is different from the refractive index of the optical liquid 130. In this way, after the light beam incident from the light-transmitting layer 160 and transmitted in the optical liquid 130 passes through the optical particles PA, the diversity of the deflection angle of the light path can be further increased. In other words, the uniformity of the brightness distribution of the light beam after passing through the light homogenizing element 800 can be further improved.

Figure 9:
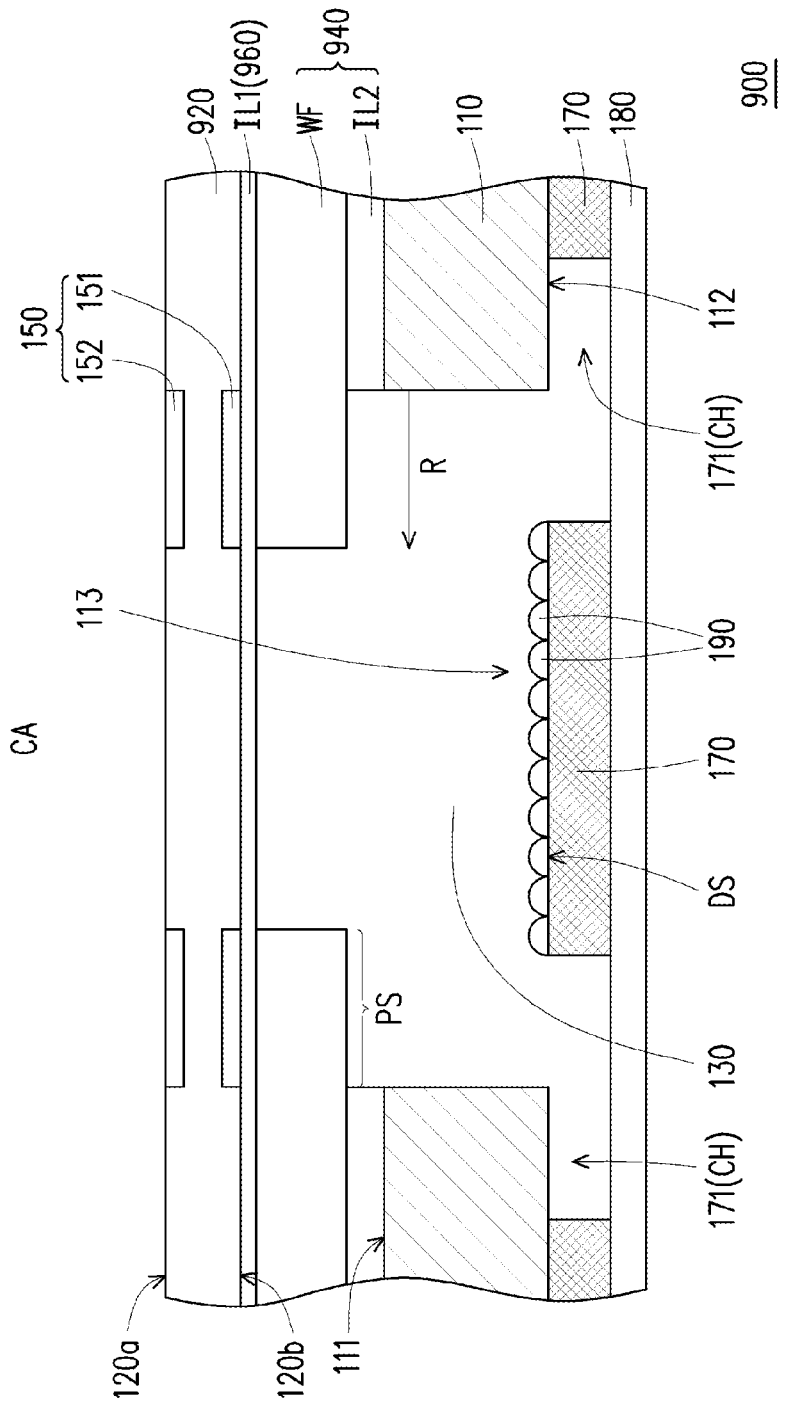
FIGS. 9 to 13 are partial sectional schematic diagrams of different light homogenizing elements according to an embodiment of the disclosure.

FIGS. 9 to 13 are partial sectional schematic diagrams of different light homogenizing elements according to an embodiment of the disclosure. Referring to FIG. 9, a light homogenizing element 900 of the embodiment is similar to the light homogenizing element 100 of FIG. 1A, and the difference the two is as follows. As shown in FIG. 9, in the embodiment, the light-transmitting layer 960 is provided between a piezoelectric film 920 and a carrier layer 940. For example, the light-transmitting layer 960 may be formed by the first insulation layer IL1 of FIG. 1A. Its material is silicon oxide and has light transmittance. The carrier layer 940 only includes the second insulation layer IL2 and the wafer layer WF. Specifically, as shown in FIG. 9, in the embodiment, the light-transmitting layer 960 (first insulation layer IL1) is stacked on the wafer layer WF, and the wafer layer WF is located between the second insulation layer IL2 and the light-transmitting layer 960.

In this way, the carrier layer 940 and the light-transmitting layer 960 may be easily fabricated by the silicon-on-insulator (SOI) process, and may be integrated with existing process technology, but the disclosure is not limited thereto. In other embodiments, the carrier layer 940 also only includes the second insulation layer IL2 and the wafer layer WF, the second insulation layer IL2 is located between the first substrate 110 and the wafer layer WF, and the light-transmitting layer 960 is located between the wafer layer WF and the piezoelectric film 920. The piezoelectric film 920 covers the light passing region CA, and its material may selectively include high molecular material or glass. Further, as shown in FIG. 9, in the embodiment, the piezoelectric film 920 may selectively cover the light passing region CA.

In this way, in the light homogenizing element 900, the predetermined driving voltage may also be applied to the piezoelectric film 920, so as to cause the piezoelectric film 920 to deform by stretching stress, thereby driving the protruding structure PS of the carrier layer 940 and the light-transmitting layer 960 into deformation. In the embodiment, the light homogenizing element 900 also has the structure of the light diffusion microstructure 190 as does the light homogenizing element 100, so the light homogenizing element 900 also has the advantages described for the light homogenizing element 100, which will not be repeated here.

Figure 10:
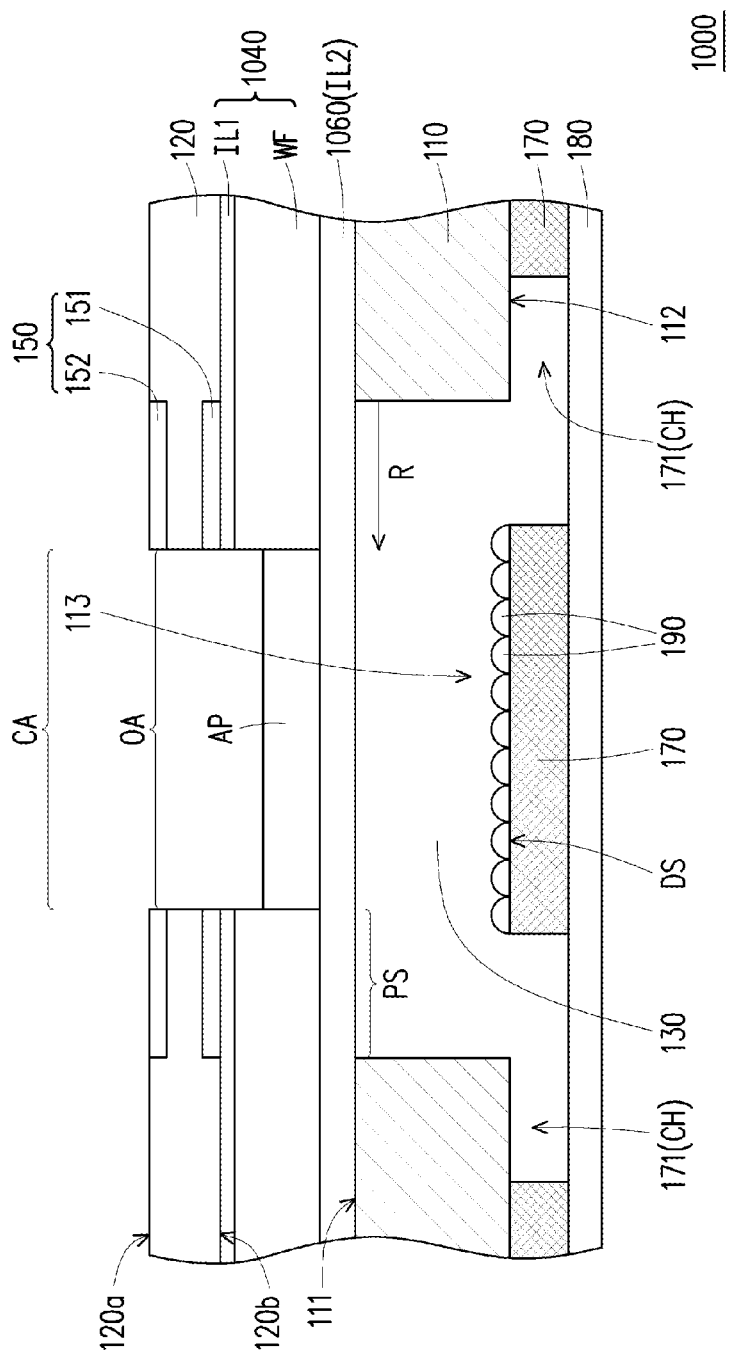

Referring to FIG. 10, a light homogenizing element 1000 of the embodiment is similar to the light homogenizing element 100 of FIG. 1A, and the difference the two is as follows. As shown in FIG. 10, in the embodiment, a carrier layer 1040 only includes first insulation layer IL1 and the wafer layer WF. A light-transmitting layer 1060 may be formed by second insulation layer IL2 of FIG. 1A. It has light transmittance, and the material is silicon oxide. Specifically, as shown in FIG. 10, the wafer layer WF is located between the first insulation layer IL1 and the light-transmitting layer 1060, and the light-transmitting layer 1060 is located between the first substrate 110 and the wafer layer WF. In the embodiment, the light homogenizing element 100 may selectively further include an auxiliary piezoelectric film AP. The auxiliary piezoelectric film AP is provided on the light-transmitting layer 1060, and may selectively cover only the light-transmitting region, so as to improve the stability of the light-transmitting layer 1060. Moreover, the auxiliary piezoelectric film AP will not be deformed by stretching stress due to the driving voltage. In the embodiment, the light homogenizing element 1000 also has the structure of the light diffusion microstructure 190 as does the light homogenizing element 100, so the light homogenizing element 1000 also has the advantages described for the light homogenizing element 100, which will not be repeated here.

Figure 11:
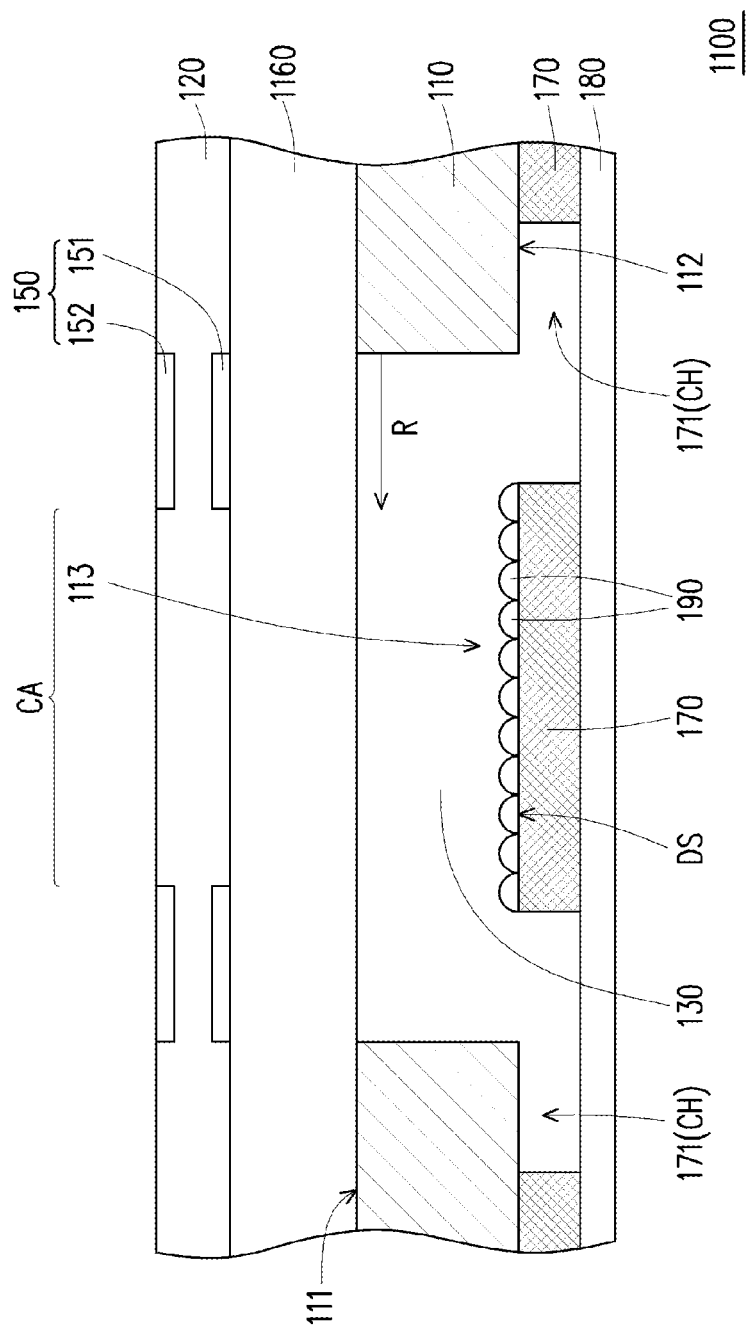

Referring to FIG. 11, a light homogenizing element 1100 of the embodiment is similar to the light homogenizing element 100 of FIG. 1A, and the difference the two is as follows. As shown in FIG. 11, in the embodiment, a light-transmitting layer 1160 is the carrier layer in FIG. 1A. It is formed by the insulation layer, and the material is silicon oxide or glass. The first substrate 110 and the light-transmitting layer 1160 may be silicon glass bond wafer (SOG wafer). In the embodiment, the light-transmitting layer 1160 of the light homogenizing element 1100 is equivalent to the protruding structure of the carrier layer of FIG. 1A extending to the center of the light passing region CA and connected to each other without a through hole penetrating the carrier layer. Specifically, as shown in FIG. 11, the light-transmitting layer 1160 is located between the first substrate 110 and the piezoelectric film 120. In this way, in the light homogenizing element 1100 of the embodiment, a predetermined driving voltage may also be applied to the piezoelectric film 120, so as to cause the piezoelectric film 120 to deform by stretching stress, thereby driving the light-transmitting layer 1160 into deformation. In the embodiment, similar to the piezoelectric film of the light homogenizing element 100, the piezoelectric film of the light homogenizing element 1100 is also deformed by stretching stress. Moreover, the light homogenizing element 1100 also has the structure of the light diffusion microstructure 190, as does the light homogenizing element 100. Therefore, the light homogenizing element 1100 also has the advantages described for the light homogenizing element 100, and will not be repeated here.

Figure 12:
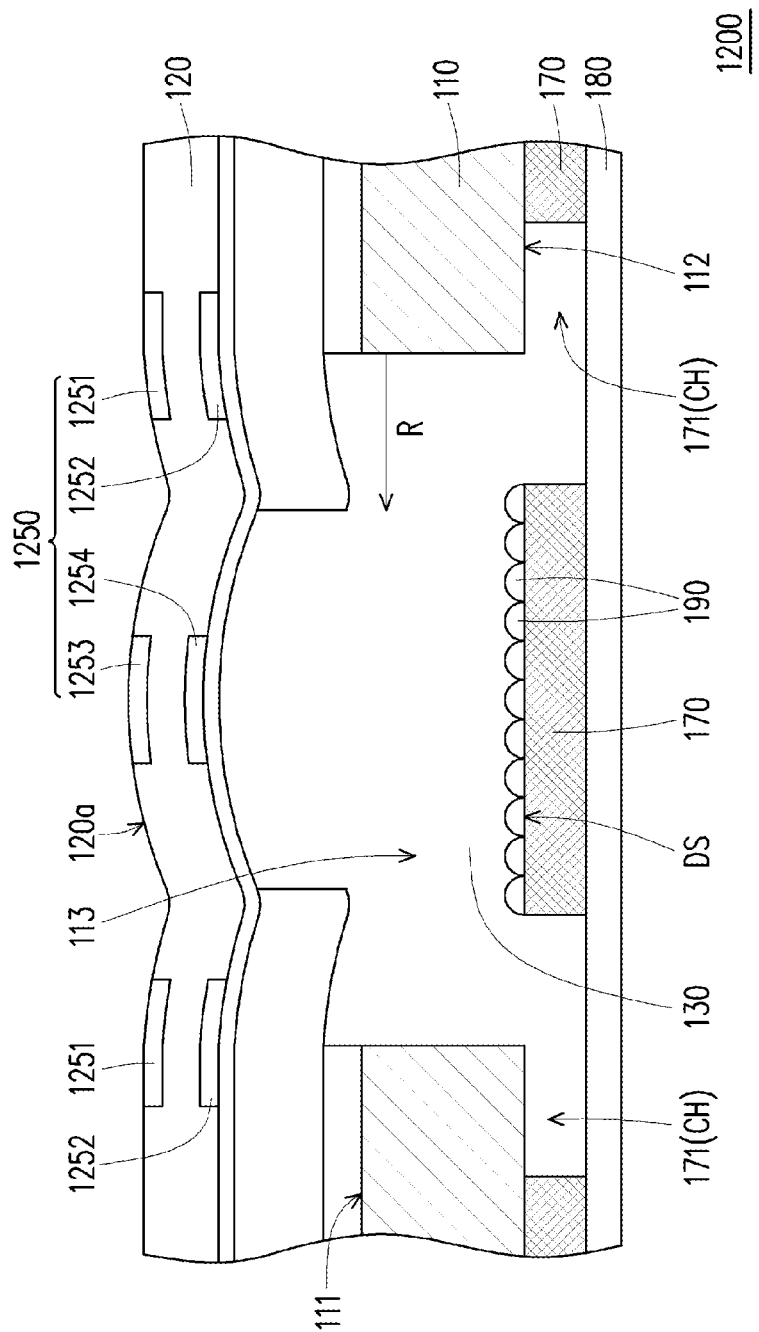

Referring to FIG. 12, a light homogenizing element 1200 of the embodiment is similar to the light homogenizing element 900 of FIG. 9, and the difference the two is as follows. As shown in FIG. 12, in the embodiment, the number of a driving electrode 1250 may be four, namely, a driving electrode 1251, a driving electrode 1252, a driving electrode 1253, and a driving electrode 1254. The configuration of the driving electrode 1251 and the driving electrode 1252 are similar to the configuration of the driving electrode 151 and the driving electrode 152 of the light homogenizing element 900 (as shown in FIG. 9), and will not be repeated here. Furthermore, the driving electrode 1253 and the driving electrode 1254 of the light homogenizing element 1200 are provided in the region surrounded by the driving electrode 1251 (or the driving electrode 1252), and the piezoelectric film 120 is sandwiched between the driving electrode 1253 and the driving electrode 1254.

For example, when the driving electrode 1251, the driving electrode 1252, the driving electrode 1253, and the driving electrode 1254 apply different driving voltages to the piezoelectric film 120, the piezoelectric film 120 will bend and deform correspondingly, causing the light beam passing through the piezoelectric film 120 to deflect. It is worth noting that at this time, a cross-sectional profile of the exterior surface 120a (i.e. the light incident surface) of the piezoelectric film 120 of the light homogenizing element 1200 is wavy. Accordingly, the diversity of the deflection angle can be further increased after the light beam passes through the piezoelectric film 120, resulting in advantages similar to those described for the light homogenizing element 100, which will not be repeated here.

Figure 13:
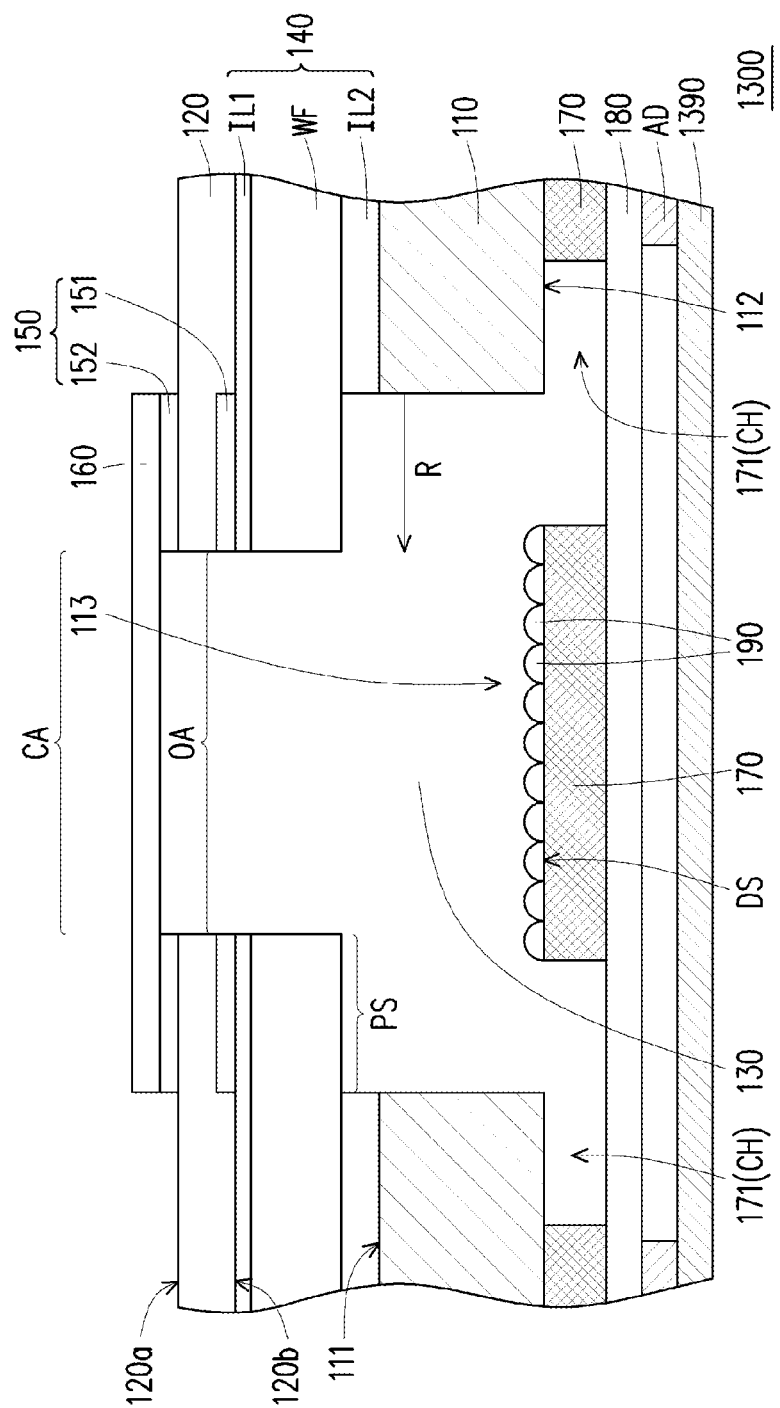

Referring to FIG. 13, a light homogenizing element 1300 of the embodiment is similar to the light homogenizing element 100 of FIG. 1A, and the difference the two is as follows. As shown in FIG. 13, in an embodiment of the disclosure, the light homogenizing element 1300 further includes a diffuser plate 1390. The elasticity film 180 is provided between the diffuser plate 1390 and the second substrate 170, and the elasticity film 180 corresponding to the at least one second cavity 171 does not contact the diffuser plate 1390. The diffuser plate 1390 may be fixed to the elasticity film 180 corresponding to the second substrate 170 or at least overlap with the part corresponding to the second substrate 170 through the adhesive layer AD, for example.

In this way, after the light beam incident from the light-transmitting layer 160 and transmitted in the optical liquid 130 passes through the light diffusion microstructures 190 and then passes through the diffuser plate 1390 to be further diffused, and the diversity of its deflection angles can be further increased. In other words, with the time-dependent deformation of the light incident surface and by configuring the light diffusion microstructures 190 and the diffuser plate 1390, the uniformity of the brightness distribution of the light beam after passing through the light homogenizing element 1300 can be improved, and the diversity of its deflection angles can be further increased.

The aforementioned light diffusion microstructures 390, the light diffusion microstructures 490, the light diffusion microstructures 590, and the light diffusion microstructures 690 may also replace the light diffusion microstructures 190 of the embodiment shown in FIGS. 7B to 13 and be configured in the aforementioned light homogenizing elements 700, 800, 900, 1000, 1100, 1200, 1300, such that the light homogenizing elements 700, 800, 900, 1000, 1100, 1200, 1300 can achieve similar effects and advantages, which will not be repeated here.

In summary, the embodiments of the disclosure have at least one of the following advantages or effects. In the embodiment of disclosure, by controlling the voltage difference between the two driving electrodes to change with time, the surface shape of the light incident surface may be quickly switched in time sequence, such that the deflection direction of the light path of the light beam passing through the light homogenizing element can change along with time. In this way, when the light homogenizing element is configured in an optical device with a laser light source, it may cause the speckle of the laser light source to change in time sequence, and can effectively reduce the speckle contrast value, which helps to improve the uniformity of the brightness distribution of the light beam. In addition, with the time-dependent deformation of the light incident surface and by configuring the light diffusion microstructure, after the light beam incident on the light homogenizing element and transmitted in the optical liquid passes through the light diffusion microstructure, the diversity of the deflection angle can be further increased, and the uniformity of the brightness distribution of the light beam after passing through the light homogenizing element can be further improved.

The foregoing description of the preferred embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the disclosure and its best mode practical application, thereby to enable persons skilled in the art to understand the disclosure for various embodiments and with various modifications as are suited to the particular use or implementation contemplated. It is intended that the scope of the disclosure be defined by the claims appended hereto and their equivalents in which all terms are meant in their broadest reasonable sense unless otherwise indicated. Therefore, the term "the disclosure", "the invention" or the like does not necessarily limit the claim scope to a specific embodiment, and the reference to particularly preferred exemplary embodiments of the disclosure does not imply a limitation on the disclosure, and no such limitation is to be inferred. The disclosure is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the disclosure. It should be appreciated that variations may be made in the embodiments described by persons skilled in the art without departing from the scope of the disclosure as defined by the following claims. Moreover, no element and component in the disclosure is intended to be dedicated to the public regardless of whether the element or component is explicitly recited in the following claims.

Finally, it should be noted that the above embodiments are only used to illustrate the technical solution of the disclosure, but the disclosure is not limited thereto. Although the disclosure is described in detail with reference to the above-mentioned embodiments, those skilled in the art should understand that the technical solutions described in the above-mentioned embodiments can still be modified, and some or all of the technical features may be replaced equivalently; such modifications or replacements do not depart from the scope of the technical solutions described by the embodiments of the disclosure.

What is claimed is:

1. A light homogenizing element, having a light incident surface and at least one diffusion surface, and comprising:
    a first substrate, having a first surface and a second surface opposite to each other, and comprising a first cavity, wherein the first cavity penetrates from the first surface to the second surface;
    a carrier layer, located on the first surface of the first substrate and having a light passing region penetrating the carrier layer, wherein the carrier layer comprises a protruding structure, and the protruding structure encloses the light passing region;
    a piezoelectric film, located on the carrier layer;
    a driving electrode, located on the carrier layer and configured to drive the piezoelectric film, wherein the driving electrode applies a driving voltage to the piezoelectric film, such that the piezoelectric film is stretched and deformed, pulling the protruding structure to bend and deform;
    a light-transmitting layer, overlapped and provided on the protruding structure, wherein a surface of the light-transmitting layer covering the light passing region is the light incident surface; and
    a plurality of light diffusion microstructures, provided on the at least one diffusion surface, wherein projections of the plurality of light diffusion microstructures on the light-transmitting layer are located in the light passing region, wherein an elasticity coefficient of the protruding structure is higher than an elasticity coefficient of the light-transmitting layer.

2. The light homogenizing element as described in claim 1, wherein the light homogenizing element further comprises an optical liquid, configured to fill the first cavity, wherein the light-transmitting layer directly contacts the optical liquid, and part of the optical liquid is located between the light incident surface and the at least one diffusion surface.

3. The light homogenizing element as described in claim 1, wherein the piezoelectric film has an opening region, and a boundary of the opening region is the same as a boundary of the light passing region.

4. A light homogenizing element having a light incident surface and at least one diffusion surface, and comprising:
    a first substrate, having a first surface and a second surface opposite to each other, and comprising a first cavity, wherein the first cavity penetrates from the first surface to the second surface;
    a carrier layer, located on the first surface of the first substrate and having a light passing region penetrating the carrier layer, wherein the carrier layer comprises a protruding structure, and the protruding structure encloses the light passing region;
    a piezoelectric film, located on the carrier layer;
    a driving electrode, located on the carrier layer and configured to drive the piezoelectric film, wherein the driving electrode applies a driving voltage to the piezoelectric film, such that the piezoelectric film is stretched and deformed, pulling the protruding structure to bend and deform;
    a light-transmitting layer, overlapped and provided on the protruding structure, wherein a surface of the light-transmitting layer covering the light passing region is the light incident surface;
    a plurality of light diffusion microstructures, provided on the at least one diffusion surface, wherein projections of the plurality of light diffusion microstructures on the light-transmitting layer are located in the light passing region;

an optical liquid, configured to fill the first cavity, wherein the light-transmitting layer directly contacts the optical liquid, and part of the optical liquid is located between the light incident surface and the at least one diffusion surface;
a second substrates; and
an elasticity film, wherein the second substrate is located on the second surface of the first substrate and comprises at least one second cavity, the at least one second cavity communicates with the first cavity of the first substrate, the second substrate is located between the elasticity film and the first substrate, and the elasticity film covers the second substrate.

5. The light homogenizing element as described in claim 4, wherein the at least one diffusion surface is part of a surface of the second substrate, and a projection of the part of the surface on the light-transmitting layer is located in the light passing region.

6. The light homogenizing element as described in claim 5, wherein the optical liquid contacts the plurality of light diffusion microstructures.

7. The light homogenizing element as described in claim 5, wherein the plurality of light diffusion microstructures are located between the second substrate and the elasticity film, and the elasticity film directly covers the plurality of light diffusion microstructures.

8. The light homogenizing element as described in claim 5, wherein some of the plurality of light diffusion microstructures are located on one side of the second substrate, and the other of the plurality of light diffusion microstructures are located on the other side of the second substrate and are provided corresponding to the some of the plurality of light diffusion microstructures.

9. The light homogenizing element as described in claim 4, wherein the at least one diffusion surface faces away from the second substrate.

10. The light homogenizing element as described in claim 4, wherein the at least one diffusion surface is a microstructure surface of the elasticity film located in the light passing region.

11. The light homogenizing element as described in claim 4, wherein the plurality of light diffusion microstructures and the at least one second cavity do not overlap.

12. The light homogenizing element as described in claim 4, wherein the light homogenizing element further comprises a diffuser plate, and the elasticity film is provided between the diffuser plate and the second substrate, and the elasticity film corresponding to the at least one second cavity does not contact the diffuser plate.

13. A light homogenizing element, having a light incident surface and at least one diffusion surface, and comprising:
a first substrate, having a first surface and a second surface opposite to each other, and comprising a first cavity, wherein the first cavity penetrates from the first surface to the second surface;
a carrier layer, located on the first surface of the first substrate and having a light passing region penetrating the carrier layer, wherein the carrier layer comprises a protruding structure, and the protruding structure encloses the light passing region;
a piezoelectric film, located on the carrier layer;
a driving electrode, located on the carrier layer and configured to drive the piezoelectric film, wherein the driving electrode applies a driving voltage to the piezoelectric film, such that the piezoelectric film is stretched and deformed, pulling the protruding structure to bend and deform;
a light-transmitting layer, overlapped and provided on the protruding structure, wherein a surface of the light-transmitting layer covering the light passing region is the light incident surface; and
a plurality of light diffusion microstructures, provided on the at least one diffusion surface, wherein projections of the plurality of light diffusion microstructures on the light-transmitting layer are located in the light passing region,
wherein the driving electrode is ring-shaped, and the driving electrode surrounds the light passing region.

14. A light homogenizing element, having a light incident surface and at least one diffusion surface, and comprising:
a first substrate, having a first surface and a second surface opposite to each other, and comprising a first cavity, wherein the first cavity penetrates from the first surface to the second surface;
a carrier layer, located on the first surface of the first substrate and having a light passing region penetrating the carrier layer, wherein the carrier layer comprises a protruding structure, and the protruding structure encloses the light passing region;
a piezoelectric film, located on the carrier layer;
a driving electrode, located on the carrier layer and configured to drive the piezoelectric film, wherein the driving electrode applies a driving voltage to the piezoelectric film, such that the piezoelectric film is stretched and deformed, pulling the protruding structure to bend and deform;
a light-transmitting layer, overlapped and provided on the protruding structure, wherein a surface of the light-transmitting layer covering the light passing region is the light incident surface; and
a plurality of light diffusion microstructures, provided on the at least one diffusion surface, wherein projections of the plurality of light diffusion microstructures on the light-transmitting layer are located in the light passing region,
wherein the driving electrode comprises a plurality of arc-shaped electrodes, the plurality of arc-shaped electrodes are arranged on a circular region, the circular region surrounds the light passing region, and a polarity direction of the driving voltage applied by any one of the plurality of arc-shaped electrodes is opposite to a polarity direction of the driving voltage applied by an adjacent other one of the plurality of arc-shaped electrodes.

15. A light homogenizing element, having a light incident surface and at least one diffusion surface, and comprising:
a first substrate, having a first surface and a second surface opposite to each other, and comprising a first cavity, wherein the first cavity penetrates from the first surface to the second surface;
a carrier layer, located on the first surface of the first substrate and having a light passing region penetrating the carrier layer, wherein the carrier layer comprises a protruding structure, and the protruding structure encloses the light passing region;
a piezoelectric film, located on the carrier layer;
a driving electrode, located on the carrier layer and configured to drive the piezoelectric film, wherein the driving electrode applies a driving voltage to the piezoelectric film, such that the piezoelectric film is stretched and deformed, pulling the protruding structure to bend and deform;
a light-transmitting layer, overlapped and provided on the protruding structure, wherein a surface of the light-transmitting layer covering the light passing region is the light incident surface; and a plurality of light diffusion microstructures, provided on the at least one diffusion surface, wherein projections of the plurality of light diffusion microstructures on the light-transmitting layer are located in the light passing region, wherein a cross-sectional profile of the light incident surface is wavy.

16. A light homogenizing element, having a light incident surface and at least one diffusion surface, and comprising:

a first substrate, having a first surface and a second surface opposite to each other, and comprising a first cavity, wherein the first cavity penetrates from the first surface to the second surface;

a carrier layer, located on the first surface of the first substrate and having a light passing region penetrating the carrier layer, wherein the carrier layer comprises a protruding structure, and the protruding structure encloses the light passing region;

a piezoelectric film, located on the carrier layer;

a driving electrode, located on the carrier layer and configured to drive the piezoelectric film, wherein the driving electrode applies a driving voltage to the piezoelectric film, such that the piezoelectric film is stretched and deformed, pulling the protruding structure to bend and deform;

a light-transmitting layer, overlapped and provided on the protruding structure, wherein a surface of the light-transmitting layer covering the light passing region is the light incident surface; and a plurality of light diffusion microstructures, provided on the at least one diffusion surface, wherein projections of the plurality of light diffusion microstructures on the light-transmitting layer are located in the light passing region, wherein the light incident surface is a flat surface, and a light incident angle between the light incident surface and the first surface of the first substrate ranges from 0.5 degrees to 20 degrees.

17. A light homogenizing element, having a light incident surface and at least one diffusion surface, and comprising:

a first substrate, having a first surface and a second surface opposite to each other, and comprising a first cavity, wherein the first cavity penetrates from the first surface to the second surface;

a carrier layer, located on the first surface of the first substrate and having a light passing region penetrating the carrier layer, wherein the carrier layer comprises a protruding structure, and the protruding structure encloses the light passing region;

a piezoelectric film, located on the carrier layer;

a driving electrode, located on the carrier layer and configured to drive the piezoelectric film, wherein the driving electrode applies a driving voltage to the piezoelectric film, such that the piezoelectric film is stretched and deformed, pulling the protruding structure to bend and deform;

a light-transmitting layer, overlapped and provided on the protruding structure, wherein a surface of the light-transmitting layer covering the light passing region is the light incident surface;

a plurality of light diffusion microstructures, provided on the at least one diffusion surface, wherein projections of the plurality of light diffusion microstructures on the light-transmitting layer are located in the light passing region; and a plurality of optical particles, distributed in the optical liquid, wherein a refractive index of the plurality of optical particles is different from a refractive index of the optical liquid.

* * * * *